(12) United States Patent
Erickson et al.

(10) Patent No.: US 6,909,591 B2
(45) Date of Patent: Jun. 21, 2005

(54) COMPLIMENTARY METAL OXIDE SEMICONDUCTOR CAPACITOR AND METHOD FOR MAKING SAME

(75) Inventors: Sean Christopher Erickson, Fort Collins, CO (US); Kevin Roy Nunn, Fort Collins, CO (US); Eric Ray Miller, Fort Collins, CO (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 10/690,861

(22) Filed: Oct. 22, 2003

(65) Prior Publication Data

US 2005/0088798 A1 Apr. 28, 2005

(51) Int. Cl.[7] .......................... H01G 4/005; H01G 4/06; H01L 27/108
(52) U.S. Cl. ........................ 361/303; 361/313; 257/308
(58) Field of Search ................................ 361/303–304, 361/311–313; 257/306–308; 438/250, 393

(56) References Cited

U.S. PATENT DOCUMENTS

| | | | | |
|---|---|---|---|---|
| 4,875,083 A | * | 10/1989 | Palmour | ...................... 257/77 |
| 5,598,317 A | * | 1/1997 | Hanrahan et al. | ........... 361/313 |
| 6,297,524 B1 | * | 10/2001 | Vathulya et al. | ............. 257/303 |
| 6,410,954 B1 | * | 6/2002 | Sowlati et al. | ............... 257/306 |

* cited by examiner

Primary Examiner—Eric W. Thomas
(74) Attorney, Agent, or Firm—Yee & Associates, P.C.

(57) ABSTRACT

An improved semiconductor capacitor and a method for fabricating the capacitor. The capacitor is located on a substrate having a first conductive section with a first outer plate connected to a first inner plate. A second conductive section having a second outer plate connected to a second inner plate is present in the capacitor. The second inner plate is located within a first hole in the first outer plate and the first inner plate is located within a second hole in the second outer plate such that a first distance is present between the second inner plate and the first outer plate and a second distance is present between the first inner plate and the second outer plate. Multiple layers of sections like the first conductive section and the second conductive section are stacked over each other and are connected to each other as part of the capacitor. Via connections may be used to connect the layers.

11 Claims, 4 Drawing Sheets

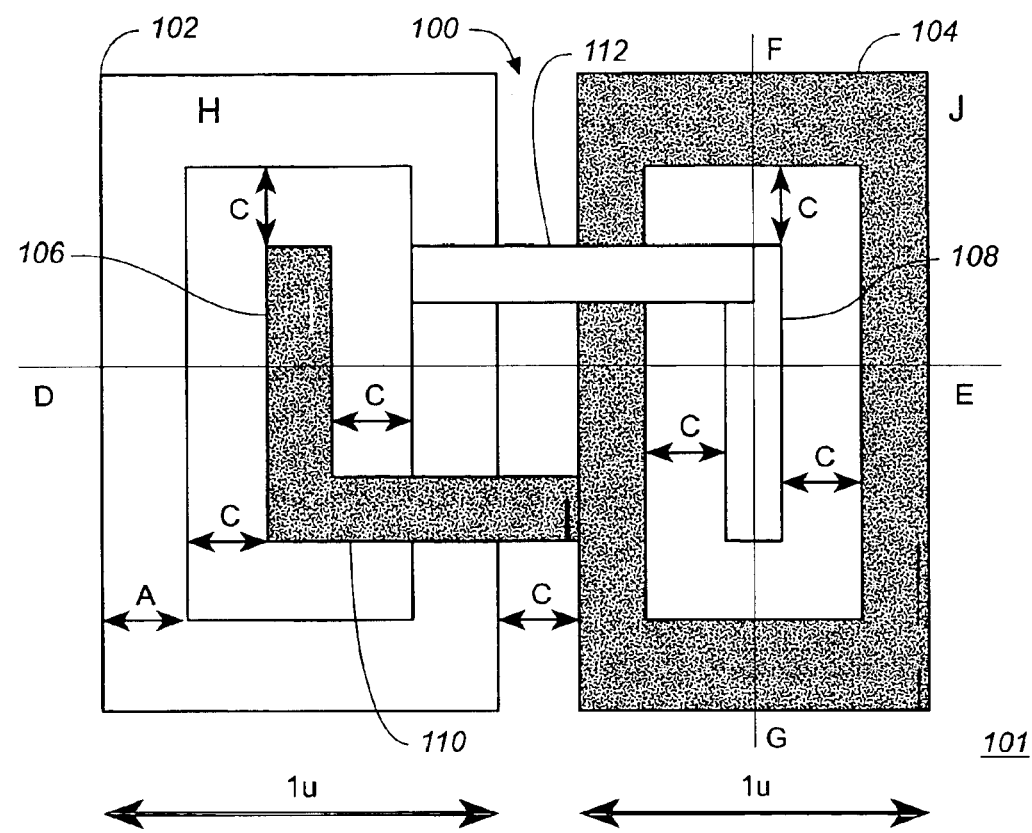
FIG._1
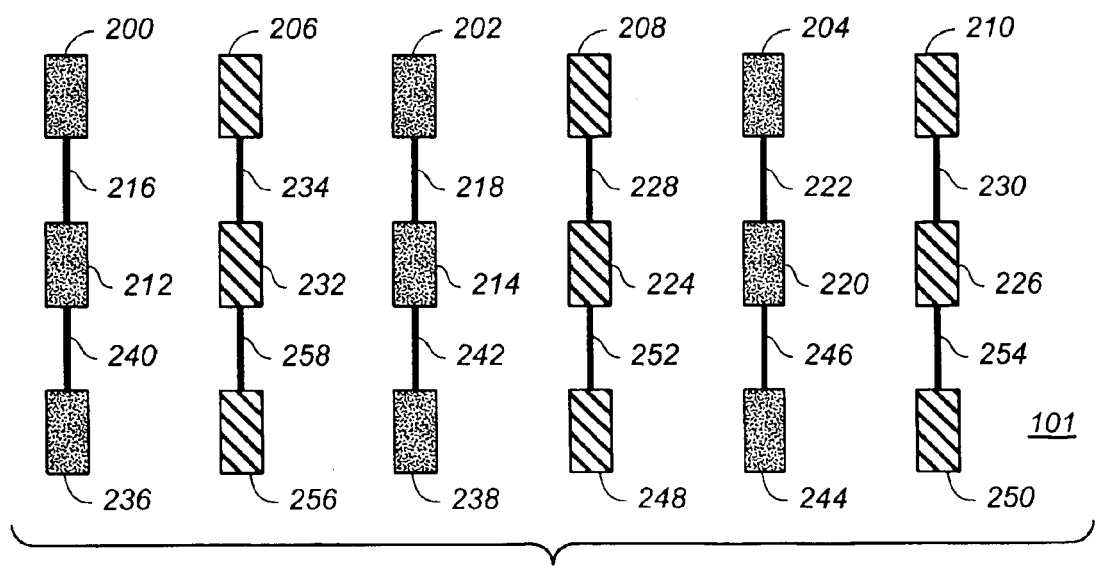
FIG._2

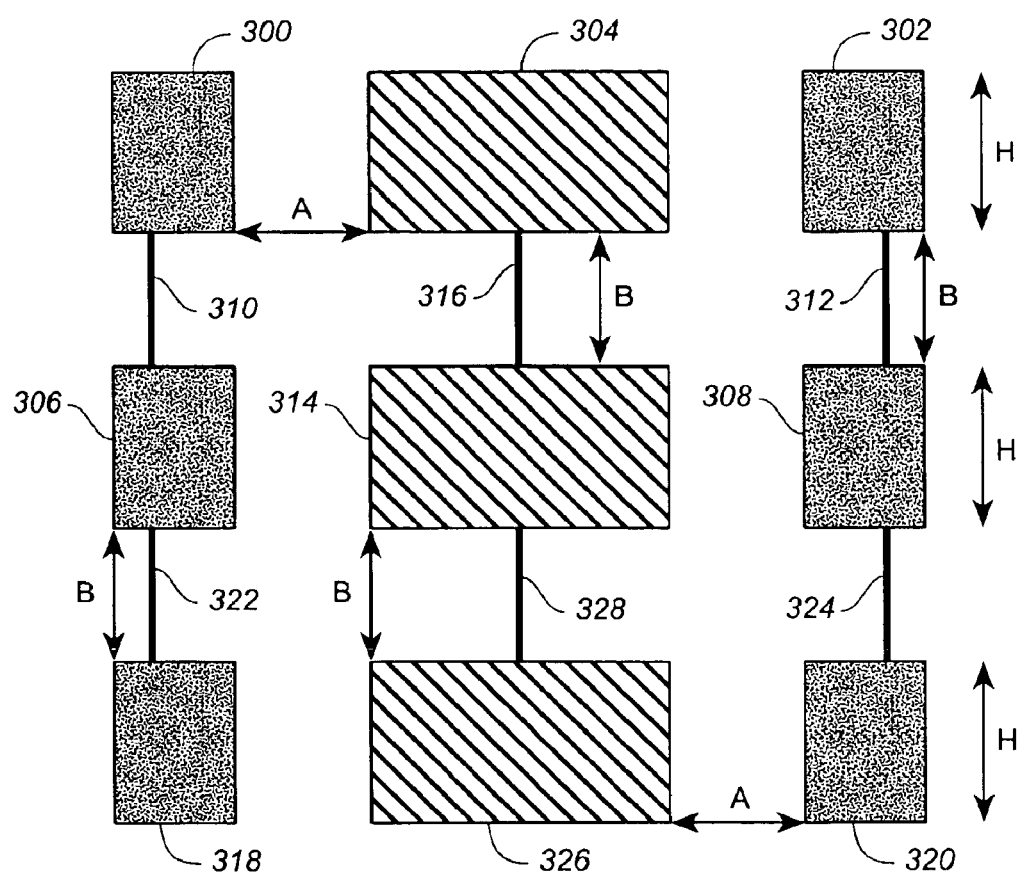
FIG._3

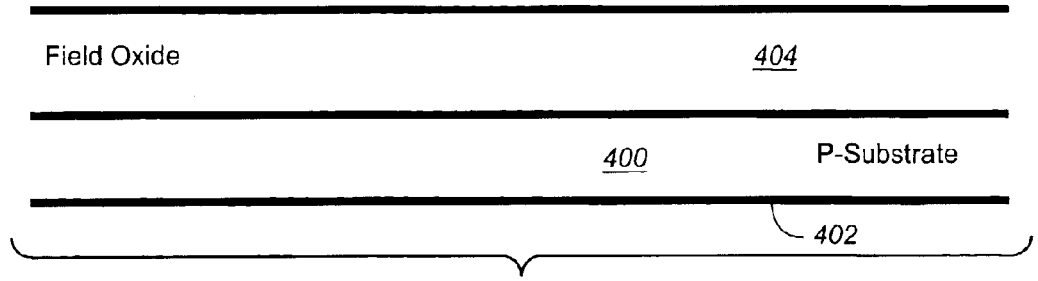
FIG._4A
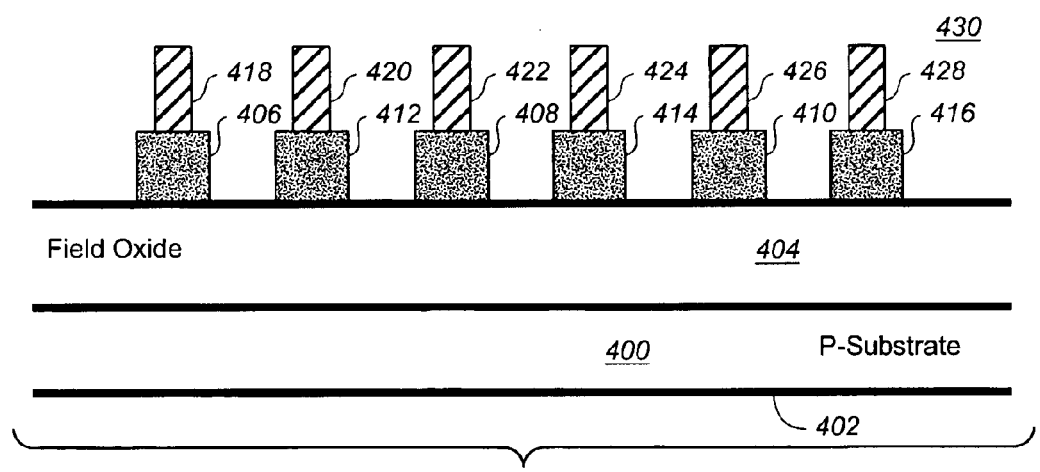
FIG._4B
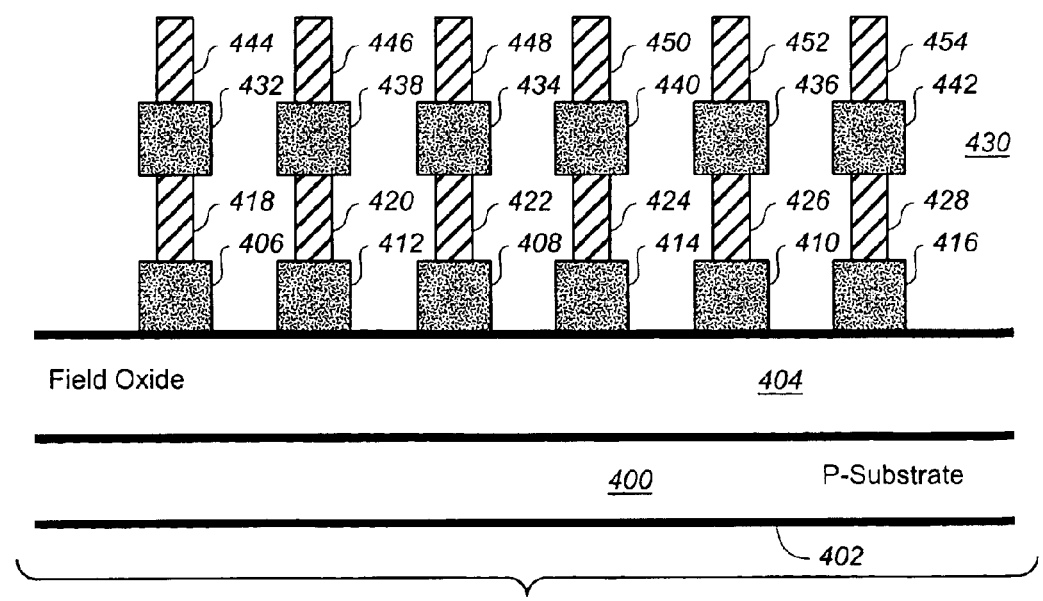
FIG._4C

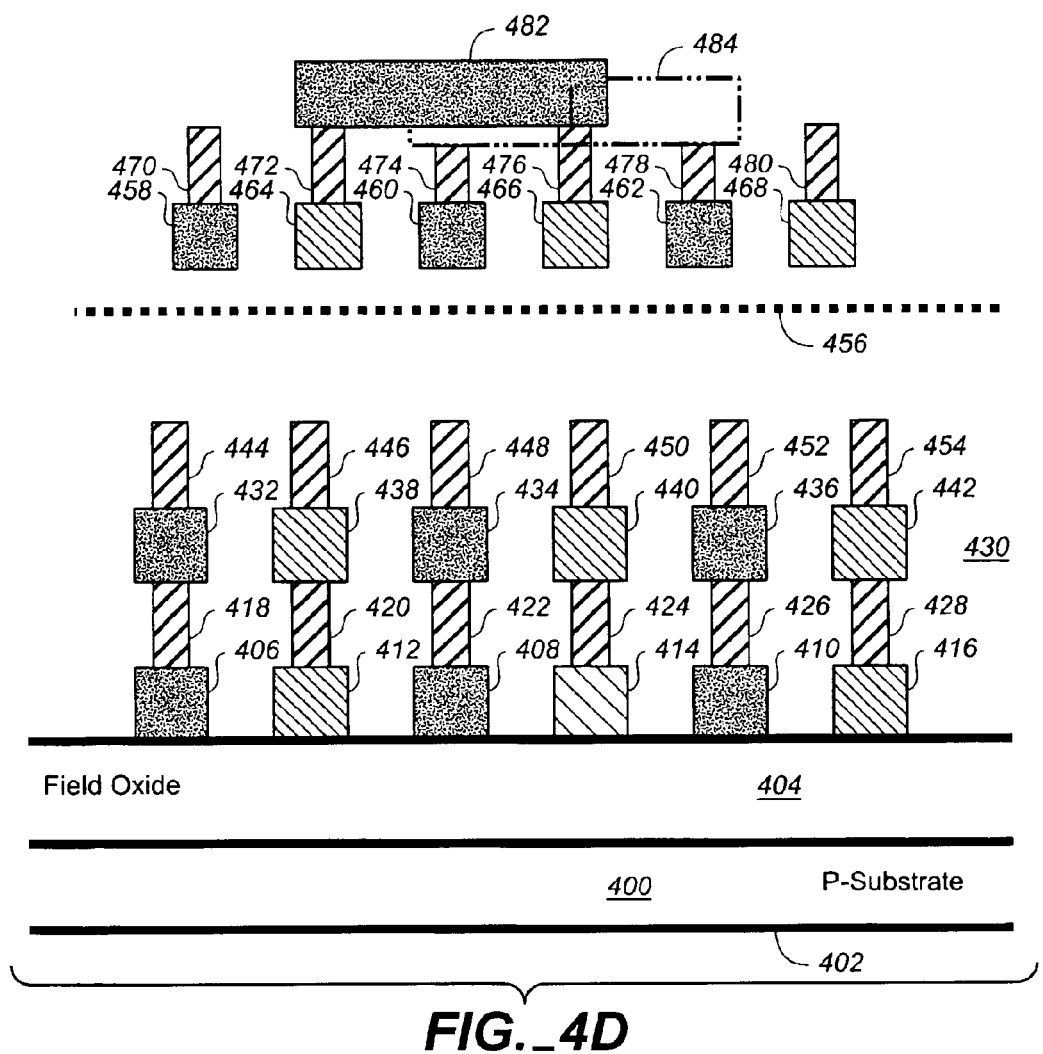
FIG._4D

COMPLIMENTARY METAL OXIDE SEMICONDUCTOR CAPACITOR AND METHOD FOR MAKING SAME

BACKGROUND OF THE INVENTION

1. Technical Field

The present invention relates generally to an integrated circuit and in particular to a semiconductor capacitor. Still more particularly, the present invention relates to a structure for a complimentary metal oxide semiconductor capacitor.

2. Description of the Related Art

Integrated circuits are commonly used in electronic devices. Integrated circuits have allowed for making many devices smaller and smaller in size. As part of this drive to make smaller devices for users, a push has been made to increase the density of devices that may be manufactured on semiconductor substrates. Silicon technology has remained a dominant force in integrated circuit fabrication. It is common to have over a million devices per chip. The increasing device count is accompanied by a shrinking minimum feature size.

By shrinking feature sizes, such as line widths, the density of devices have been greatly increased. In some cases, shrinking of feature sizes does not always provide for significant reduction in the size of devices. One such device is a complimentary metal oxide semiconductor capacitor. Current designs require relatively large amounts of semiconductor areas when compared to other types of devices, such as transistors. The capacitive density of current capacitors is low compared to those densities achieved by transistors. Some designs for increasing the density of capacitors involve creating a lateral capacitor. Many of these designs, however, are proprietary or may have relatively high costs to fabricate.

Therefore, it would be advantageous to have an improved complimentary metal oxide semiconductor capacitor with a high-density design.

SUMMARY OF THE INVENTION

The present invention provides an improved semiconductor capacitor and a method for fabricating the capacitor. The capacitor is located above the substrate within the dielectric having a first conductive section with a first outer plate connected to a first inner plate. A second conductive section having a second outer plate connected to a second inner plate is present in the capacitor. The second inner plate is located within a first hole in the first outer plate and the first inner plate is located within a second hole in the second outer plate such that a first distance is present between the second inner plate and the first outer plate and a second distance is present between the first inner plate and the second outer plate. Multiple layers of sections like the first conductive section and the second conductive section are stacked over each other and are connected to each other as part of the capacitor. Via connections may be used to connect the layers.

BRIEF DESCRIPTION OF THE DRAWINGS

The novel features believed characteristic of the invention are set forth in the appended claims. The invention itself however, as well as a preferred mode of use, further objects and advantages thereof, will best be understood by reference to the following detailed description of an illustrative embodiment when read in conjunction with the accompanying drawings, wherein:

FIG. 1 is a diagram illustrating a layout for a complimentary metal oxide semiconductor capacitor in accordance with the preferred embodiment of the present invention;

FIG. 2 is a diagram illustrating a cross section along line D-E in FIG. 1 in accordance with a preferred embodiment of the present invention;

FIG. 3 is a cross section of a capacitor along line F-G in FIG. 1 is illustrated in accordance with the preferred embodiment of the present invention; and FIGS. 4A–4D are cross sectional diagrams illustrating steps used to fabricate a capacitor in accordance with a preferred embodiment of the present invention.

DETAILED DESCRIPTION

The processes, steps, and structures described below-do not form a complete process flow for manufacturing integrated circuits. The present invention can be practiced in conjunction with integrated circuit fabrication techniques currently used in the art, and only so much of the commonly practiced process steps are included as necessary for an understanding of the present invention. The figures represent cross sections of a portion of an integrated circuit during fabrication and are not drawn to scale, but instead are drawn so as to illustrate important features of the invention.

With reference now to the figures and in particular with reference to FIG. 1, a diagram illustrating a layout for a complimentary metal oxide semiconductor capacitor is depicted in accordance with the preferred embodiment of the present invention. Capacitor 100 is a complimentary metal oxide semiconductor capacitor in these examples. Capacitor 100 is formed within a dielectric. In these examples, this dielectric is SiO2 with capacitor 100 being isolated from other devices and the substrate by dielectric 101. The layout illustrated in FIG. 1 shows capacitor 100 in a block unit form. Capacitor 100 contains two subunits containing exterior plate 102, exterior plate 104, interior plate 106.and interior plate 108. One subunit is formed by exterior plate 102 and interior plate 108, while the second subunit is formed by exterior plate 104 and interior plate 106.

Each of these subunits are identical in construction, but wired such that the capacitor subunits are of alternating polarity. Exterior plate 102 and exterior plate 104 are constructed of tightly spaced metal in these examples. Interior plate 106 is connected to exterior plate 104 by metal line 110. Interior plate 108 is connected to exterior plate 102 by metal line 112. Distance C is the distance between the interior plates and the exterior plates. In illustrative examples, this distance is about 0.2 $\mu$m. In this example, metal lines 112 and 110 are only found at the top-most level.

In the illustrative examples, increase in this distance degrades the capacitor. In FIG. 1 inner plate 106 is enclosed by outer plate 102, then in the second unit plate 108 is enclosed by plate 104. These two enclosing structures are hollowed out rectangles that are located side by side to contribute to the capacitor structure. The pattern is then repeated such that no two identically wired structures are next to each other. Further, multiple layers may be constructed to select a particular capacitance value. The spacing between coincidental horizontal metal layers is designed to be at a minimum in the depicted example, spacing C is 0.2 $\mu$m The different plates may have multiple layers with the same configuration as shown in FIG. 1. Each of these layers is interconnected to each other. Only one metal line, such as metal line 110 and metal line 112 is needed to connect the layers within an exterior plate to the layers within an interior plate. With reference now to FIG. 2, a diagram illustrating a cross section along line D-E in FIG. 1 is depicted in accordance with a preferred embodiment of the present invention. Sections 200 and 202 correspond to the upper most level for outer plate 102. Section 204 corresponds to interior plate 108 in FIG. 1. Section 206 corresponds to interior plate 106 in FIG. 1. Sections 208 and 210 correspond to outer plate 104 in FIG. 1. These sections represent the upper most or top layer as shown in the layout of capacitor 100 in FIG. 1. Although FIG. 2 illustrates three layers of plates, other numbers of plate layers may be used depending on the particular implementation. Each of these layers use rectangular shapes. Other geometric configurations may be used depending on the implementation. As can be seen from these layers, capacitor 100 in FIG. 1 is a lateral capacitor with multiple identical layers. Section 212 and section 214 form a lower layer for an exterior plate that is connected to sections 200 and 202 through via connections 216 and 218. The vertical spacing between these layers ranges from about 0.30 μm to about 0.47 μm. In the illustrative examples, 0.40 μm is a typical range.

Section 220 forms a lower layer of an interior plate that is connected to section 204 through via 222. Sections 224 and 226 are part of an exterior plate below the upper metal layer formed in sections 208 and 210. These sections are connected to each other through via connections 228 and 230. Section 232 is an interior plate connected to section 206 through via connection 234. Sections 236 and 238 are part of another exterior plate below sections 212 and 214. These sections are connected to each other by via connections 240 and 242. Section 244 is part of an interior plate below the interior plate for section 220. These two sections in FIG. 2 are connected to each other by via connection 246. Sections 248 and 250 are a cross section from an exterior plate below the outer plate formed by sections 224 and 226. Sections 248 and 250 are connected to sections 224 and 226 through via connections 252 and 254. Section 256 is part of an interior plate below the interior plate for section 232. These two sections in FIG. 2 are connected to each other by via connection 258. In this example, three layers of interior plates are connected to each other through via connections and three layers of exterior plates are connected to each other through via connections. In FIG. 2, the exterior plates and interior plates have no connection to each other.

Multiple layers of these two subunits are employed to form capacitor 100. These layers are connected to each other to form capacitor 100. In these examples, the layers are connected to each other through via connections. In the illustrative embodiment, a lowest or bottom metal layer available, metal 1 (M1) and then the next metal layer above is stacked on top. Width A is about 0.2 μm in the illustrative example. In these examples, metal layers M1, M2, and M3, are used for the plates on the different layers. A metal layer M4 is used for wiring and signal routing with respect to capacitor 100. In the illustrative embodiment, the M1 layer is the thinnest layer with a range from about 0.19 μm to about 0.33 μm. Typically, this layer is about 0.26 μm thick. The M2 through M4 layers typically have a range from about 0.25 μm to about 0.45 μm. 0.35 μm is the typical thickness for these layers. In this example, metal layer M4 is used for wiring and signal routing. The metal layers are formed using aluminum in the depicted examples. Further, other types of metals may be used for the metal layers. For example, capacitor 100 also may be constructed using copper in a dual damascene process.

Turning now to FIG. 3, a cross section of a capacitor is illustrated in accordance with a preferred embodiment of the present invention. This cross section is taken along line F-G for capacitor 100 in FIG. 1. Section 300 and section 302 form part of exterior plate 104 in FIG. 1. Section 304 forms part of inner plate 108 in FIG. 1. These sections form the top layer of capacitor 100 in FIG. 1. Additional sections for the exterior and interior plates are formed below and connected to each other through via connections. Section 306 and section 308 are a cross section of an exterior plate below those for sections 300 and 302. Sections 306 and 308 are connected to sections 300 and 302 through via connections 310 and 312. Section 314 is part of an interior plate below section 304 and is connected to section 304 through via connection 316. Sections 318 and 320 are cross sections of an exterior plate below the exterior plate containing sections 306 and 308. These sections are connected to each other through via connections 322 and 324. Section 326 is part of an interior plate and is connected to an interior plate containing section 314 through via connection 328. Spacing of A is present between the interior and exterior plates. In the illustrative examples, this spacing is about 0.2 μm. The thickness of each of the layers in these examples varies. Spacing H is about 0.35 μm for the top and middle layer. The lower layer has a height I, which is about 0.26 μm in these examples. Spacing B is typically 0.4 μm.

The vertical construction in these cross sections are all attached by tightly packed via connections between two adjoining metal layers, M1–M2, M2–M3, M3–M4. The vias that connect these metal layers are 0.16 μm by about 0.16 μm in a square shape. These vias are typically spaced apart at about 0.2 μm from each other. The metal line widths in these examples are kept at a minimum, such as about 0.2 μm to provide for close spacing. In these examples, a key for the construction is long facing lines of metal with alternating polarity. As illustrated, the internal or interior plate is enclosed by a hollow stack rectangle of alternating polarity making one subunit. The copy of this subunit is mirrored and constructed close by using minimum spacing. This other subunit has exact opposite wiring and polarity.

Turning now to FIGS. 4A–4D, cross sectional diagrams illustrating steps used to fabricate a capacitor are depicted in accordance with a preferred embodiment of the present invention. In FIG. 4A, substrate 400 is a p type substrate with back 402. Field oxide 404 is formed on substrate 400 through an oxidation process. Field oxide 404 usually has a thickness from about 0.2.2 μm to about 3.0 μm, with 2.6 μm being a typical thickness. In FIG. 4B, a layer of metal has been deposited on field oxide 404. The metal is a M1 metal for this bottom layer of the capacitor. This metal layer is about 0.26 μm thick in the depicted example. This metal layer is selectively etched to form metal lines for a first exterior plate, such as exterior plate 102, a second exterior plate, such as exterior plate 104, a first interior plate, such as interior plate 106, and a second interior plate, such as interior plate 108 in FIG. 1. Section 406 and section 408 correspond to a portion of the first exterior plate and section 410 corresponds to a portion of the first interior plate. Section 414 and section 416 correspond to a portion of the second exterior plate and section 412 corresponds to a portion of the second interior plate.

Via connectors 418, 420, 422, 424, 426, and 428 are formed to connect the sections in this bottom layer to a next layer for the exterior and interior plates. These via connectors are formed using aluminum, either in pure form or allowed with small amounts of silicon (Si) and/or copper (Cu). In these examples, aluminum deposition is used to deposit the aluminum to form the via connectors. As illustrated, via connectors 418, 420, 422, 424, 426, and 428 have a height of about 0.4 μm. The via connectors are square in shape in the illustrative examples and are about 0.16 μm wide. All of the sections are formed in dielectric 430, which may be formed using $SiO_2$.

In FIG. 4C, a second layer metal layer, M2, having a thickness of about 0.35 μm is formed. The metal layer is selectively etched to form sections 432, 434, 436, 438, 440, and 442. A second set of via connects 444, 446, 448, 450, 452, and 454 also are formed. These via connectors have a thickness of about 0.35 μm, and are used to connect this second layer to a third layer of the capacitor.

Turning to FIG. 4D, line 456 is used to indicate that any number of layers may be formed after the second layer. A final metal layer is deposited and selectively etched to form sections 458, 460, 462, 464, 466, and 468. Next, via connectors 470, 472, 474, 476, 478, and 480 are formed. These via connectors are used to connect the capacitor to other components and to interconnect an exterior plate to an interior plate. Metal line 482 corresponds to metal line 110 in FIG. 1, while metal line 484 corresponds to metal line 112 in FIG. 1. The process illustrated in FIGS. 4A–4D is performed using an aluminum process to form the metal layers and connectors.

Thus the present invention provides an improved capacitor and method for making the capacitor for an improved lateral capacitor. This design allows for a greater density of components because the capacitor does not require as much real estate or surface area to fabricate as other capacitors with a similar capacitance value. Further the capacitance can be selected by adding additional layers to the structure. Additional subunits of capacitor 100 from FIG. 1 may be added with opposing polarity to reach a desired capacitance. The capacitance for a layer may be identified. In this manner, additional layers may be added to reach the desired capacitance.

The description of the preferred embodiment of the present invention has been presented for purposes of illustration and description, but is not intended to be exhaustive or limited to the invention in the form disclosed. Many modifications and variations will be apparent to those of ordinary skill in the art. The embodiment was chosen and described in order to best explain the principles of the invention the practical application to enable others of ordinary skill in the art to understand the invention for various embodiments with various modifications as are suited to the particular use contemplated.

What is claimed is:

1. A semiconductor capacitor comprising:
   a first conductive section having a first outer plate connected to a first inner plate, wherein the first outer plate and the first inner plate are substantially coplanar with one another; and
   a second conductive section having a second outer plate connected to a second inner plate, wherein the second outer plate and the second inner plate are substantially coplanar with one another, and wherein the second inner plate is located within a first hole in the first outer plate and the first inner plate is located within a second hole in the second outer plate such that a first distance is present between the second inner plate and the first outer plate and a second distance is present between the first inner plate and the second outer plate;
   wherein the first distance is equal to the second distance.

2. The semiconductor capacitor of claim 1, wherein the first conductive section and the second conductive section arc substantially coplanar with one another.

3. The semiconductor capacitor of claim 1, wherein the first outer plate and the second outer plate have a rectangular shape.

4. The semiconductor capacitor of claim 1, wherein the first distance is about 0.2 μm and the second distance is about 0.2 μm.

5. The semiconductor capacitor of claim 1, wherein the first section and the second section have a thickness of about 0.25 μm to about 0.45 μm.

6. The semiconductor capacitor of claim 1 further comprising:
   a third conductive section having an third outer plate connected to a third inner plate; and
   a fourth conductive section having a fourth outer plate connected to a fourth inner plate, wherein the fourth inner plate is located within a third hole in the third outer plate and the third inner plate is located within a fourth hole in the fourth outer plate such that a third distance is present between the fourth inner plate and the third outer plate and a fourth distance is present between the third inner plate and the fourth outer plate and wherein the third conductive section and the fourth conductive section are located below the first conductive section and the second conductive section.

7. The semiconductor capacitor of claim 6, wherein the third outer plate is located below the first outer plate, fourth outer plate is located below the second outer plate, the third inner plate is located below the first inner plate, and the fourth inner plate is located below the second inner plate.

8. The semiconductor capacitor of claim 1, the first conductive section is connected to a third conductive section by a first set of via connections and wherein the second conductive section is connected to the fourth conductive section by a second set of via connections.

9. The semiconductor capacitor of claim 8, wherein first conductive section is spaced apart of the third section by about 0.2 μm and the second conductive section is spaced apart from the fourth conductive section by about 0.2 μm.

10. The semiconductor capacitor of claim 1, wherein the first conductive section and the second conductive section are formed from a common metal layer.

11. The semiconductor capacitor of claim 1, wherein the first outer plate is connected to the first inner plate by a first metal line and wherein the second outer plate is connected to the second inner plate by a second metal line, and wherein the first metal line and the second metal line are formed from a common metal layer.

* * * * *